United States Patent [19]
Kazama et al.

[11] Patent Number: 5,567,267
[45] Date of Patent: Oct. 22, 1996

[54] METHOD OF CONTROLLING TEMPERATURE OF SUSCEPTOR

[75] Inventors: Kouichi Kazama, Yamanashi-ken; Mitsuaki Komino, Tokyo; Kenji Ishikawa, Sagamihara; Yoichi Ueda, Yokohama, all of Japan

[73] Assignee: Tokyo Electron Limited, Tokyo, Japan

[21] Appl. No.: 154,451

[22] Filed: Nov. 19, 1993

[30] Foreign Application Priority Data

| | | | |
|---|---|---|---|
| Nov. 20, 1992 | [JP] | Japan | 4-333786 |
| Dec. 22, 1992 | [JP] | Japan | 4-356442 |
| Mar. 1, 1993 | [JP] | Japan | 5-064678 |

[51] Int. Cl.$^6$ ................................. C23F 1/02
[52] U.S. Cl. .................. 156/345; 118/724; 118/725; 204/298.09; 204/298.33; 165/80.2
[58] Field of Search ................. 156/345, 646.1, 156/643.1; 118/724, 725, 728; 204/298.09, 298.37, 298.33; 165/80.1, 80.2, 80.5; 216/58, 67; 219/121.43

[56] References Cited

U.S. PATENT DOCUMENTS

| | | | |
|---|---|---|---|
| 5,078,851 | 1/1992 | Nishihata | 204/298.34 |
| 5,255,153 | 10/1993 | Nozawa et al. | 361/234 |
| 5,290,381 | 3/1994 | Nozawa | 156/345 |
| 5,320,982 | 6/1994 | Tsubone | 437/228 |
| 5,376,213 | 12/1994 | Ueda | 156/345 |

FOREIGN PATENT DOCUMENTS

| | | |
|---|---|---|
| 60-158627 | 8/1985 | Japan. |
| 3-134187 | 6/1991 | Japan. |
| 4-196528 | 7/1992 | Japan. |

*Primary Examiner*—R. Bruce Breneman
*Assistant Examiner*—Anita Alanko
*Attorney, Agent, or Firm*—Oblon, Spivak, McClelland, Maier & Neustadt, P.C.

[57] ABSTRACT

A susceptor of a plasma etching apparatus is arranged on a heater fixing frame incorporating a heater. The fixing frame is arranged on a cooling block containing liquid nitrogen. A boundary clearance is formed between the fixed frame and the cooling block and on a heat transfer path. A method of controlling the temperature of the susceptor includes an initialization mode, an idle mode following the initialization mode, process and maintenance modes selectively following the idle mode. The initialization mode includes the steps of filling the boundary clearance with a heat transfer gas and observing a change in temperature of the susceptor caused by cold transferred from the cooling block. The idle mode is executed after the temperature of the susceptor reaches a predetermined temperature. The idle mode includes the step of exhausting the boundary clearance to set it in a vacuum state to sever the heat transfer path. The process mode includes the steps of filling the boundary clearance with the heat transfer gas and processing a semiconductor wafer on the susceptor. The maintenance mode includes the steps of keeping the vacuum state of the boundary clearance to sever the heat transfer path and performing maintenance.

13 Claims, 9 Drawing Sheets

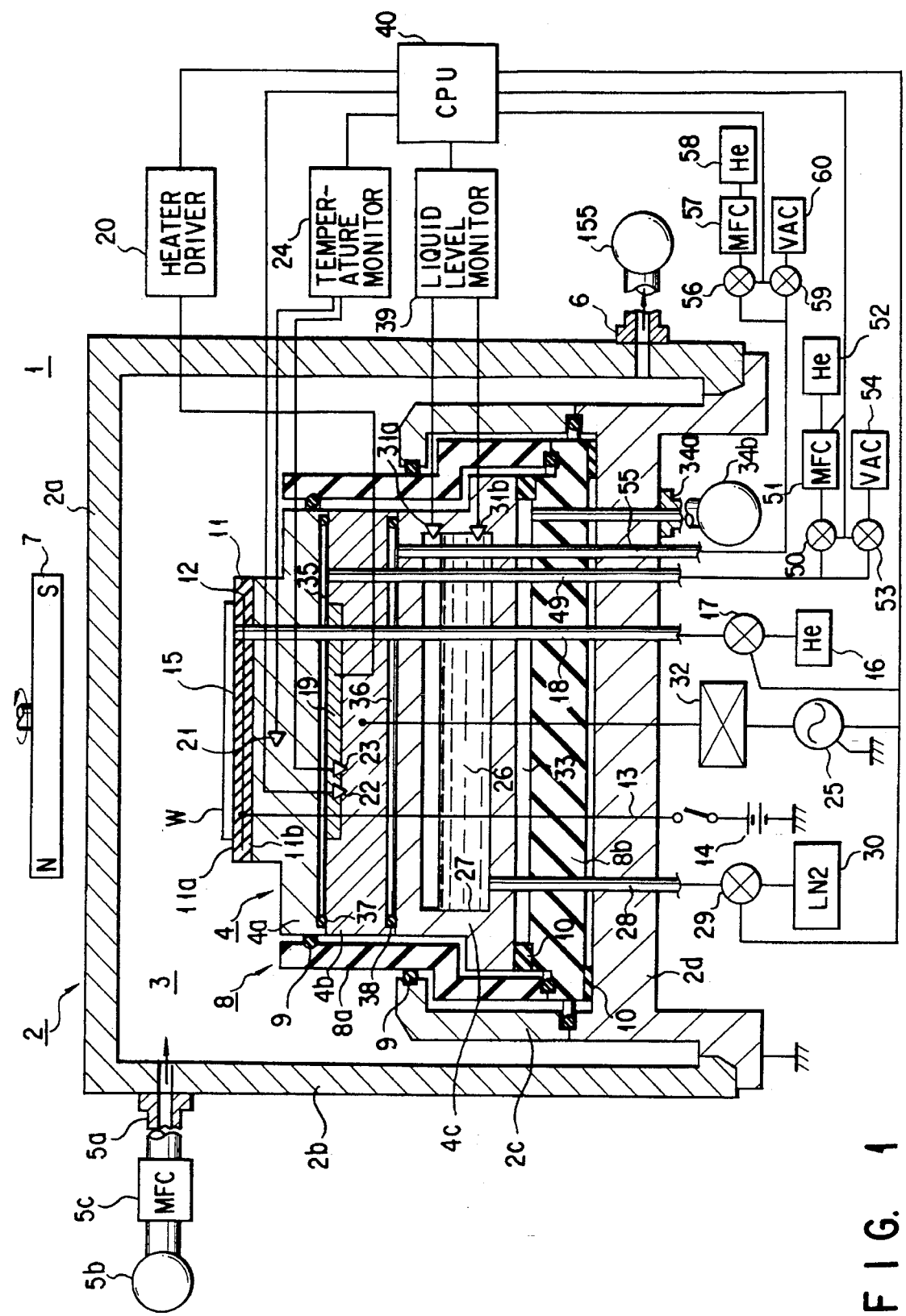
F I G. 1

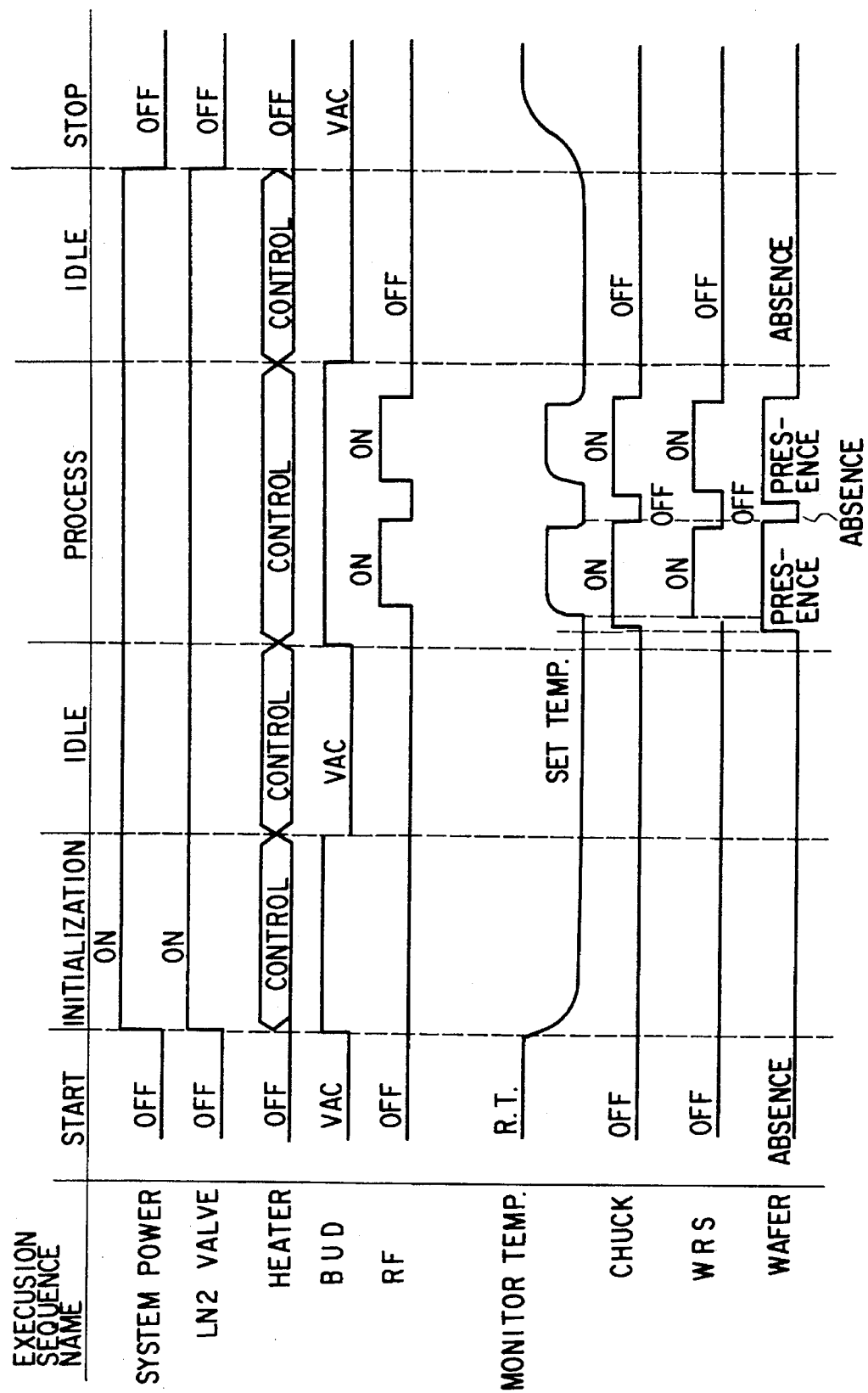
F I G. 4

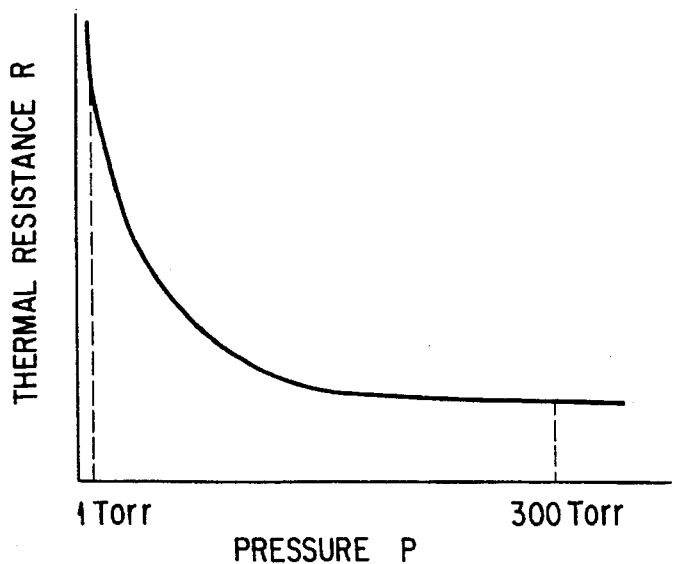
F I G. 6
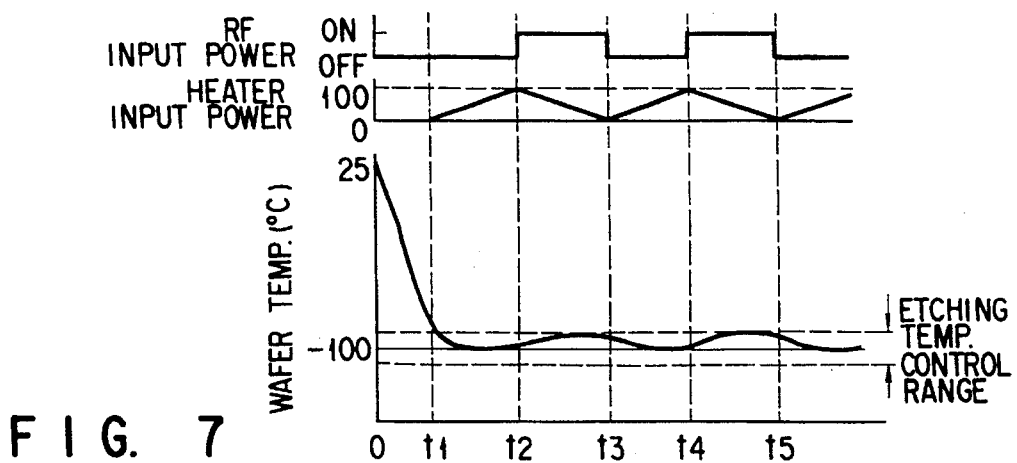
F I G. 7
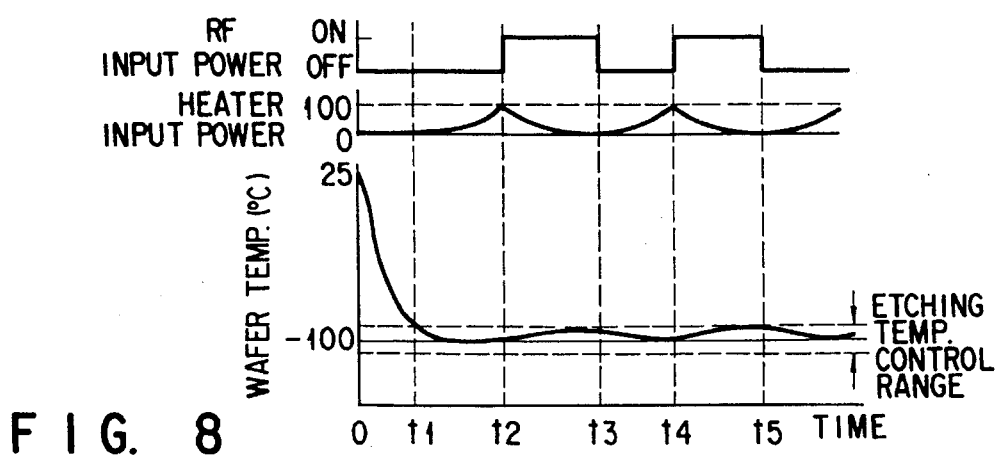
F I G. 8

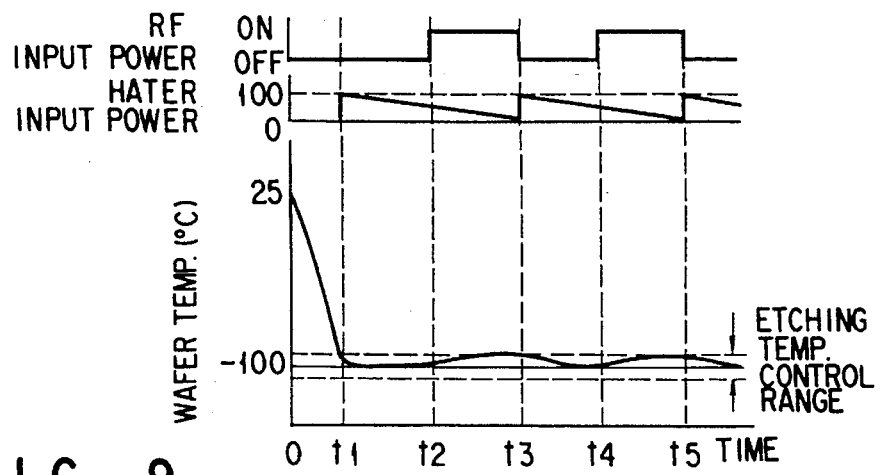
F I G. 9
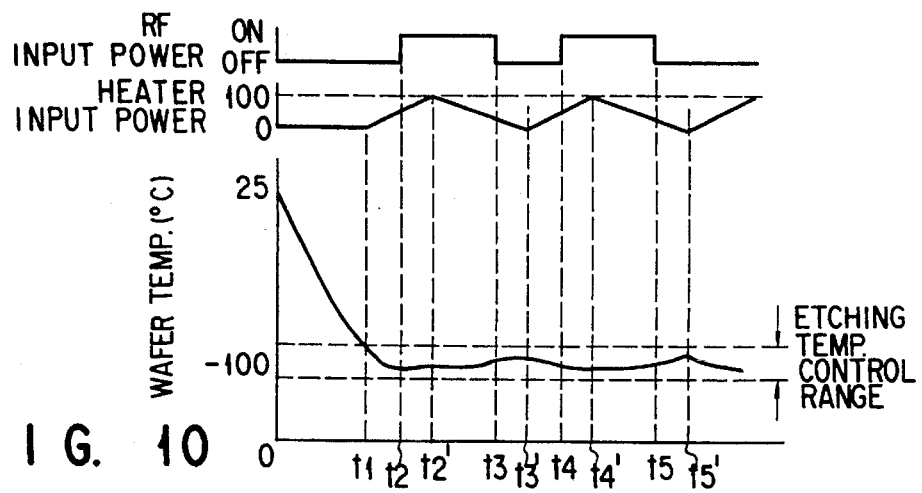
F I G. 10
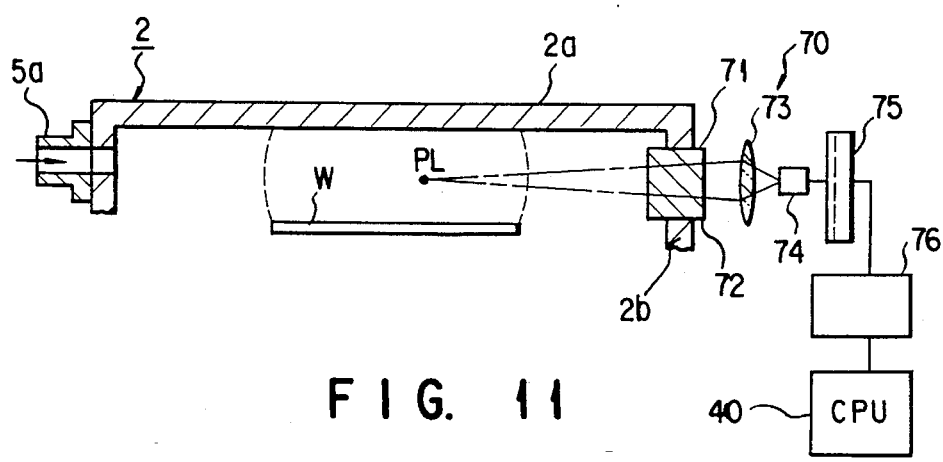
F I G. 11

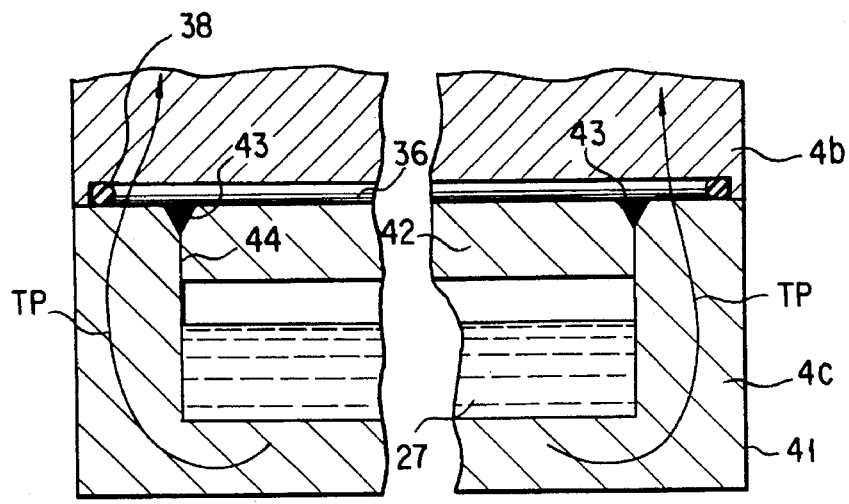
F I G. 12
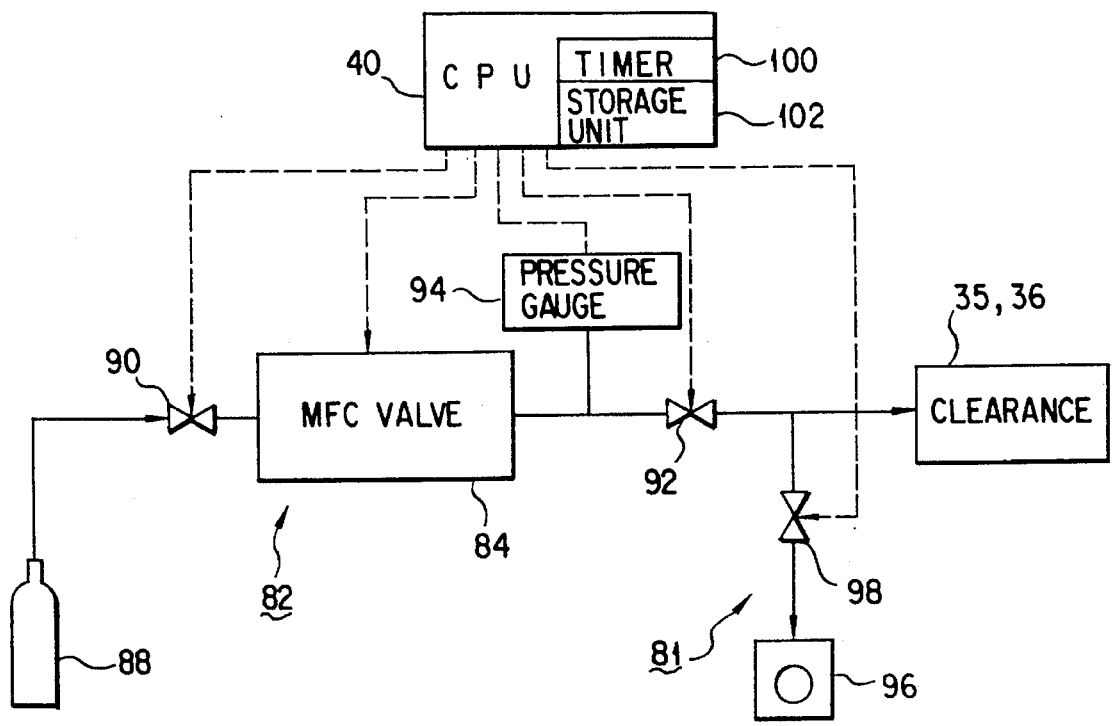
F I G. 13

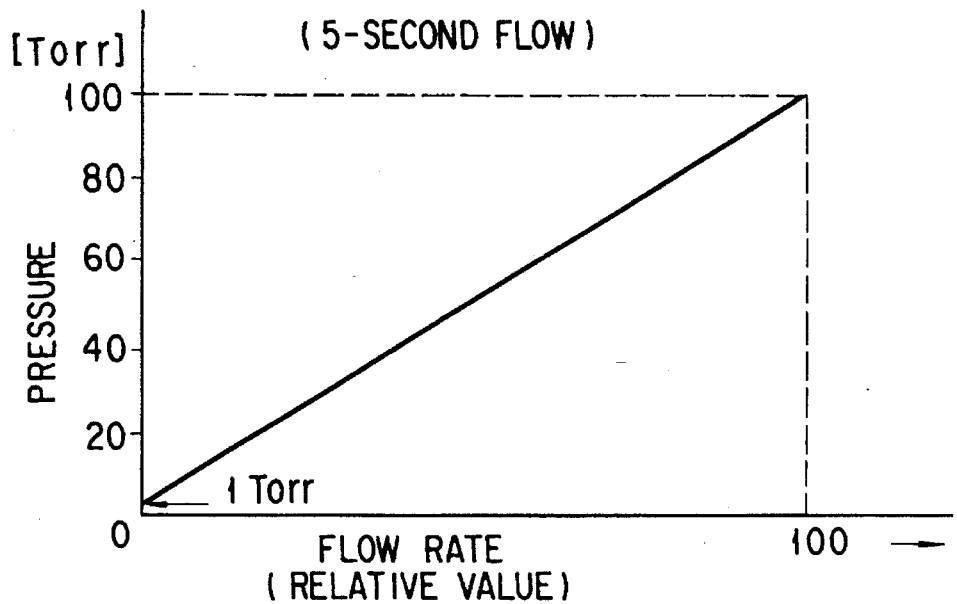
F I G. 14
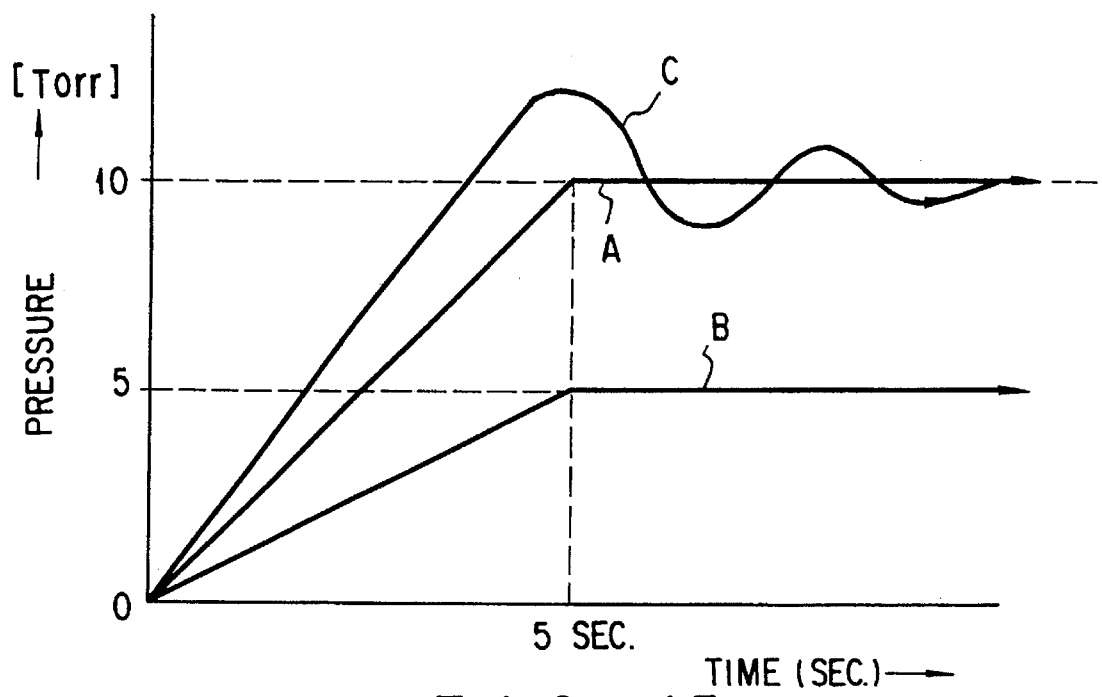
F I G. 15

METHOD OF CONTROLLING TEMPERATURE OF SUSCEPTOR

BACKGROUND OF THE INVENTION

1. Field of the Invention

The present invention relates to a method of controlling the temperature of a susceptor for supporting a substrate to be processed in a process chamber of a processing apparatus and, for example, to a method of controlling the temperature of a susceptor in a plasma etching apparatus for a semiconductor wafer.

2. Description of the Related Art

In a technique of processing an object to be processed using a reactive gas plasma, e.g., in a dry etching technique of performing etching, there is known a method in which a wafer to be processed is etched while being cooled to obtain etching anisotropy and a high selection ratio. For example, the following low-temperature etching method is disclosed in Published Unexamined Japanese Patent Application No. 60-158627. That is, a wafer is placed on an electrode having a refrigerant reservoir to decrease the temperature of the reaction surface, thereby suppressing the side etching reaction.

In the low-temperature etching, it is important to keep the temperature of the reaction surface of a wafer within an allowable processing temperature range so as to increase the production yield and perform microprocessing on the surface. However, in a conventional plasma etching apparatus, 40 to 50% of RF power applied to generate a plasma are converted into heat energy, and the conversion efficiency to heat energy is not constant due to various factors. For this reason, it is difficult to control the wafer temperature correctly.

In a plasma etching apparatus, a large amount of a refrigerant, e.g., liquid nitrogen, is required in order to achieve a desired ultra low temperature atmosphere. In addition, a long period of time is required to achieve the ultra low temperature atmosphere. For example, about 100 minutes are required to cool a susceptor from room temperature to −140° C.

Especially, when substrates to be processed of a plurality of lots are continuously processed, a large heat loss occurs every time a lot is loaded/unloaded, and temperature adjustment must be performed every time a heavy loss occurs. For this reason, a heat energy loss from the susceptor is large, thereby prolonging the processing time.

In addition, since the interior of the process chamber of the apparatus is exposed to various process gases and a plasma in a vacuum atmosphere, and is very sensitive to contamination, maintenance must be performed as needed. However, when the process chamber is opened for the maintenance, and the susceptor set in a low-temperature state is abruptly exposed to the atmospheric air, moisture contained in the atmospheric air is brought into contact with the susceptor set in the low-temperature state to often cause condensation, and the apparatus may then break down depending on conditions.

The following time-sharing etching method (intermittent etching method) is disclosed in Published Unexamined Japanese Patent Application No. 3-134187. That is, when an RF power supply is turned on to generate a plasma, and the wafer temperature is increased to a predetermined temperature range or more, etching is stopped. When the wafer temperature drops, the RF power supply is operated again, thereby controlling the wafer temperature within the predetermined temperature range. According to this intermittent etching method, while the RF power supply is set in an OFF state to control the wafer temperature, except for a case wherein the RF power supply must be turned off for processing steps, a time loss occurs, thereby decreasing the throughput. For example, assuming that the duty ratio in 1-minute etching is 50%, the processing time is doubled, i.e., becomes 2 minutes.

In Published Unexamined Japanese Patent Application No. 4-196528, the following etching apparatus is disclosed. That is, a thermoresistive member for decreasing cooling power from a cooling unit is arranged on the heat transfer path to a susceptor, and the temperature of heat generated by the thermoresistive member is controlled, thereby controlling the wafer temperature. However, the heat transfer path of the etching apparatus is complicated and long, and satisfactory wafer temperature control cannot be performed.

SUMMARY OF THE INVENTION

It is an object of the present invention to minimize consumption of a susceptor refrigerant.

It is another object of the present invention to minimize a cold loss from a susceptor in loading/unloading a lot even when substrates to be processed of a plurality of lots are continuously processed.

It is still another object of the present invention to avoid condensation on a susceptor surface when a process chamber is exposed to an ambient atmosphere to perform the maintenance of the process chamber.

According to the present invention, there is provided a method of controlling a temperature of a susceptor for supporting a substrate to be processed in a process chamber of a processing apparatus including a first block arranged in the process chamber and including the susceptor for supporting the substrate, a second block, arranged in the process chamber, for supplying cold to the first block, a boundary clearance being formed between the first and second blocks and on a heat transfer path, supplying means for supplying a heat transfer gas to the boundary clearance, and exhausting means for exhausting the boundary clearance, the method comprising the step of: executing an idle mode, the idle mode including the step of exhausting the boundary clearance to set the boundary clearance in a vacuum state so as to sever the heat transfer path; selecting one of a process mode and a maintenance mode to which the idle mode is to be shifted, in a state in which the heat transfer path is severed in the idle mode; shifting a state in which the heat transfer path is severed in the idle mode to the process mode when the process mode is selected, the process mode including the step of filling the boundary clearance with the heat transfer gas to complete the heat transfer path and the step of processing the substrate on the susceptor while cooling the substrate by cold from the second block; and shifting a state in which the heat transfer path is severed in the idle mode to the maintenance mode when the maintenance mode is selected, the maintenance mode including the step of keeping the vacuum state of the boundary clearance to sever the heat transfer path and the step of opening the process chamber to an ambient atmosphere after a temperature of the first block becomes not less than a predetermined temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic sectional view showing a magnetron plasma etching apparatus according to an embodiment of the present invention;

FIG. 4 is a timing chart of an operation including a process mode of the apparatus shown in FIG. 1;

FIG. 6 is a graph showing a relationship between the pressure of a heat transfer gas in a clearance and the thermal resistance of the clearance;

FIG. 7 is a timing chart showing a relationship between the input power to an RF power supply and the input power to a heater;

FIG. 8 is a timing chart showing another relationship between the input power of the RF power supply and the input power to the heater;

FIG. 9 is a timing chart showing still another relationship between the input power of the RF power supply and the input power to the heater;

FIG. 10 is a timing chart showing still another relationship between the input power of the RF power supply and the input power to the heater;

FIG. 11 is a sectional view showing a part of a modification, which has a plasma emission detection unit, of the apparatus shown in FIG. 1;

FIG. 12 is an enlarged sectional view showing a cooling block;

FIG. 13 is a schematic view showing a mechanism for controlling the pressure in a boundary clearance;

FIG. 14 is a graph showing a relationship between the pressure in the boundary clearance and the flow rate of a heat transfer gas; and FIG. 15 is a graph showing changes in pressure in the boundary clearances obtained by the control method of the present invention and a conventional control method in comparison with each other.

DETAILED DESCRIPTION OF THE PREFERRED EMBODIMENTS

Figure 2:
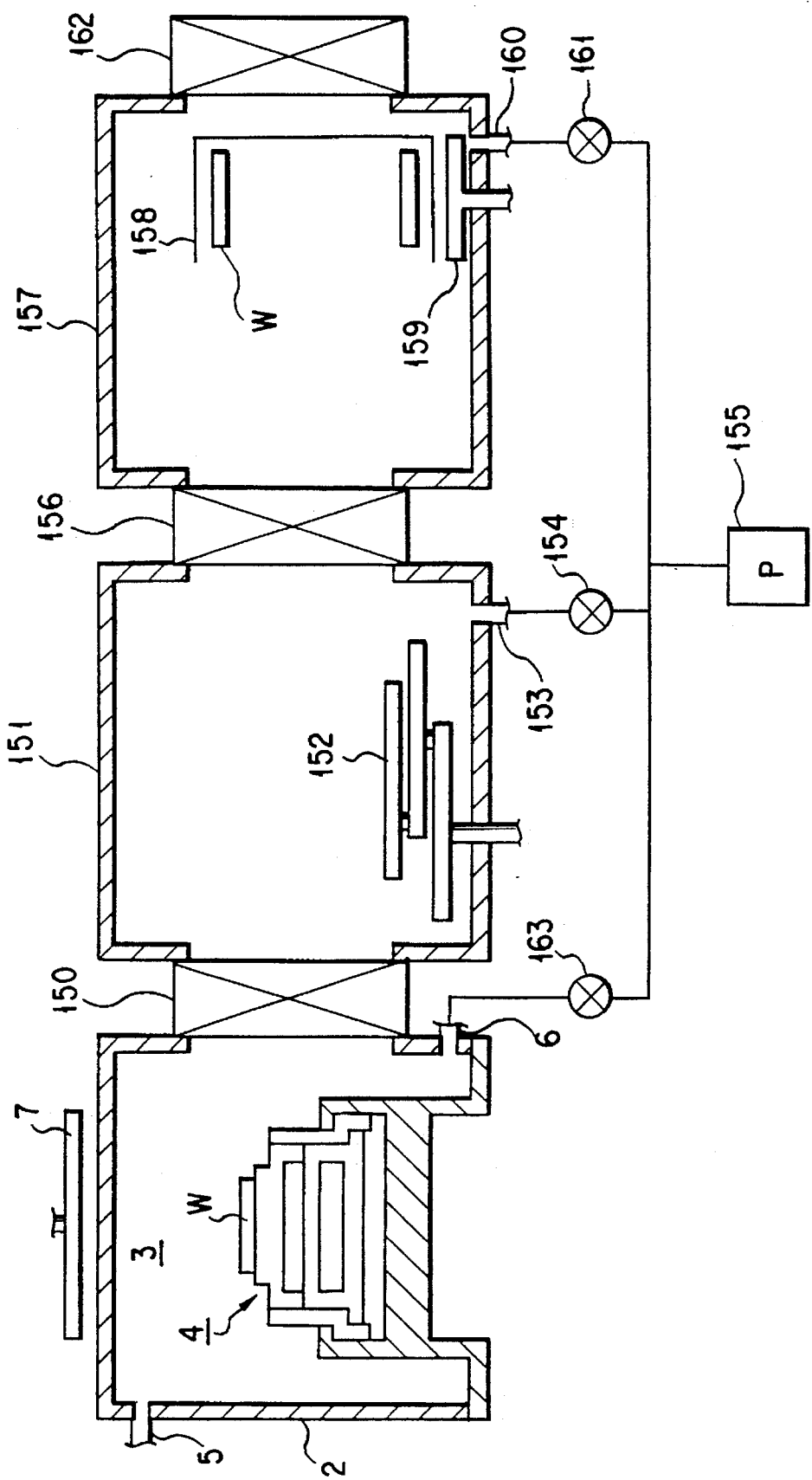
FIG. 2 is a schematic sectional view showing the overall etching system using the apparatus shown in FIG. 1.

A plasma etching apparatus 1 shown in FIG. 1 comprises a housing 2 consisting of a material such as aluminum, and a process chamber 3 is air-tightly formed in the housing 2. A mount 4 for placing and fixing a substrate to be processed, e.g., a semiconductor wafer W, is arranged in the process chamber 3.

The housing 2 has a double structure constituted by an outer cylinder 2b integrated with a top portion 2a and an inner cylinder 2c having an inner flange portion at its upper portion. The outer cylinder 2b and the inner cylinder 2c are air-tightly mounted and fixed on a bottom portion 2d which has a slightly raised base plate.

A gas supply pipe 5a capable of supplying a process gas such as an HF gas from a process gas source 5b into the process chamber 3 through a mass-flow controller (MFC) 5c or the like is arranged at an upper portion of the outer cylinder 2b of the housing 2. A gas exhaust pipe 6 is arranged at a lower portion of the outer cylinder 2b of the housing 2 on a side opposite to the side on which the gas supply pipe 5a is arranged. An exhausting means, e.g., a vacuum pump 155 is connected to the gas exhaust pipe 6, and the housing 2 can be evacuated to a vacuum.

A magnetic field generation member, e.g., a permanent magnet 7, for forming a magnetic field horizontal to the target surface of the substrate to be processed, e.g., the semiconductor wafer W, is rotatably arranged above the top portion 2a of the housing 2. Magnetron discharge can be generated in the process chamber by forming the horizontal magnetic field generated by the permanent magnet and an electric field perpendicular to the magnetic field.

As shown in FIG. 1, a side insulating member 8a and a bottom insulating member 8b of an insulating frame 8 are arranged to cover the side and bottom portions of the mount 4. When the mount 4 is arranged in a space formed by the insulating frame 8, the mount 4 is kept insulated from the housing 2 which is grounded outside the apparatus. The manner of electric insulation between the mount 4 and members arranged outside the housing 2 is disclosed in copending U.S. Ser. No. 08/104,475, now U.S. Pat. No. 5,376,213, the teachings of which are hereby incorporated by reference.

The housing 2, the insulating frame 8, and the mount 4 are separated from each other by members such as an O-ring 9 and a spacer 10 consisting of an insulating material so as not to be in contact with each other. A space 33 formed between the insulating frame 8 and the mount 4 can be evacuated by an exhausting means, e.g., a vacuum pump 34b, through an exhaust pipe 34a.

In the illustrated example, the mount 4 has three stacked members, i.e., a susceptor 4a, a heater fixing frame 4b, and a cooling block 4c. The members 4a, 4b, and 4c are fixed to each other by known fixing means (not shown) such as screws.

An electrostatic chuck 11 is arranged on the upper surface of the susceptor 4a, and a substrate to be processed, e.g., a semiconductor wafer W, is placed and fixed on the upper surface of the electrostatic chuck 11. Three vertically extending through holes (not shown) are formed in the electrostatic chuck 11, and vertically movable pins (not shown) are arranged in the three holes, respectively. The three vertically movable pins assist a convey arm 152 (shown in FIG. 2) in loading/unloading of the wafer W.

The electrostatic chuck 11 is obtained by adhering, e.g., a pair of polyimide resin films 11a and 11b to each other, and a thin conductive film 12 such as copper foil is sealed in the electrostatic chuck 11. The conductive film 12 is connected to a DC power supply 14 through a conductive wire 13. The electrostatic chuck 11 is generally formed like a flat circular sheet to match the shape of the wafer W.

In an operative state, a high DC voltage, e.g., 2.0 kV, is applied from the DC power supply 14 to the conductive film 12 of the electrostatic chuck 11. In this manner, static electricity is generated by polarization on the surface of the electrostatic chuck 11, and the wafer W is chucked by the Coulomb's force onto the upper surface of the electrostatic chuck 11.

A heat transfer gas can be supplied from a heat transfer gas source 16 into a gap or interstice 15 formed between the electrostatic chuck 11 and the wafer W through a valve 17 and a supply pipe 18. In this embodiment, an inert gas such as helium is used as the heat transfer gas. However, this gas is just an example, and any heat transfer medium which has high heat conductivity and hardly reacts with a process gas in the process chamber 3 can be used as the heat transfer gas. The gap 15 does not form an air-tight space, unlike a boundary clearance 35 or 36 (to be described later). However, as described above, the wafer W is placed and fixed on the susceptor 4a by a Coulomb's force on the electrostatic chuck 11. Therefore, a heat transfer gas having a pressure of less than 20 Torr can be supplied into the gap 15 by the Coulomb's force without leaking in the process chamber 3. A temperature sensor, e.g., a temperature measurement resistor 21, is arranged in the susceptor 4a. The temperature sensor 21 is connected to a host controller or a CPU 40 through a temperature monitor 24.

A temperature adjustment unit, e.g., a heater 19, for adjusting the temperature of the target surface of the wafer W is arranged on the heater fixing frame 4b of the mount 4. In this embodiment, although the heater 19 is arranged in the upper recessed portion of the heater fixing frame 4b, the heater 19 may be arranged in another portion. The heater 19 is connected to a heater driver 20 for controlling the output from the heater. A temperature sensor, e.g., a temperature measurement resistor 22, is arranged near the heater 19. The temperature sensor 22 detects the temperature of the fixing frame 4b and sends it to the CPU 40 to drive the heater driver 20, thereby controlling the temperature of the heater 19.

In this embodiment, in addition to the temperature sensor 22, a monitoring temperature sensor, e.g., a temperature measurement resistor 23 is arranged near the heater 19 and the temperature sensor 22. A signal from the temperature sensor 23 is sent to the temperature monitor 24. The monitor 24 and the CPU 40 interlock with each other to prevent an erroneous operation of the apparatus, and make stable control of the heater temperature possible. In this embodiment, the temperature sensors 22 and 23 are arranged near the heater 19 of the fixing frame 4b. However, the positions of these sensors 22 and 23 are not limited to this, and they can be arranged at any positions where they can detect temperature characteristics in the mount 4.

The heater fixing frame 4b and the cooling block 4c are entirely and completely covered with the susceptor 4a and the insulating frame 8 to be insulated from the processing atmosphere. In addition, as described above, the insulating member 9 such as an O-ring is interposed between the side wall of the susceptor 4a and the inner surface of the side member 8a of the insulating frame 8 to prevent entrance of a process gas. With the above arrangement, the fixing frame 4b and the cooling block 4c which are connected to an RF power supply 25 and have a complicated wiring structure are prevented from being contaminated. In addition, since the susceptor 4a portion can be replaced independently of the fixing frame 4b and the cooling block 4c, maintenance of the processing apparatus can be easily performed.

A refrigerant reservoir 27 for reserving a refrigerant 26 such as liquid nitrogen is arranged in the cooling block 4c. The reservoir 27 communicates with a liquid nitrogen source 30 through a pipe 28 and a valve 29. Since the inner bottom wall surface of the reservoir 27 is, e.g., porously formed, nuclear boiling can occur in it, and the temperature difference between the liquid nitrogen in the reservoir 27 and the cooling block 4c can be kept at about 1° C. As a refrigerant, for example, liquid helium, liquid hydrogen, or liquid oxygen can be used in place of the liquid nitrogen.

As shown in FIG. 12, the cooling block 4c is constituted by an air-tight housing comprising a main body 41 having an opening in its upper portion and a lid 42 for closing the opening. The lid 42 is welded on the opening after the bottom wall surface is subjected to a treatment for nuclear boiling. In order to increase cold efficiency, the thermal resistance of a heat transfer path TP formed from the bottom portion of the cooling block, on which the nuclear boiling surface is formed, to the wafer must be minimized. From this point of view, although the thermal resistance at a welded portion 43 is low, the thermal resistance at a boundary 44 between the main body 41 and the lid 42 is high due to a small gap therebetween. That is, it is desirable not to interpose the boundary 44 in the heat transfer path TP. For this reason, in the apparatus of this embodiment, as shown in FIG. 12, the boundary between the main body 41 and the lid 42 is offset from the heat transfer path TP.

In contrast to this, in a conventional structure, an opening is formed in the lower portion of a main body, and a lid on which a nuclear boiling surface is formed is welded on the opening. For this reason, the boundary between the main body and the lid is positioned in a heat transfer path, thereby decreasing heat efficiency.

A liquid level detecting means for detecting the liquid level of the refrigerant 26 is arranged in the refrigerant reservoir 27. The liquid level detecting means comprises temperature sensors 31a and 31b arranged in correspondence with the upper limit level and lower limit level within an allowable liquid level range. A liquid level monitor 39 calculates the liquid level of the refrigerant 26 on the basis of a correlation function between signals sent from the temperature sensors 31a and 31b, and sends the calculation result to the CPU 40. The CPU 40 opens/closes the valve 29 according to the signals to control the amount of the refrigerant 26, e.g., liquid nitrogen 30, in the reservoir 27.

As has been described above, the susceptor 4a, the heater fixing frame 4b, and the cooling block 4c are insulated from the housing 2 by the insulating frame 8, and constitute cathodes having the same electrical polarity. The fixing frame 4b is connected to the RF power supply 25 having a frequency, e.g., 13.45 MHz or 40.68 MHz, through a matching circuit 32. Counter electrodes are constituted by the mount 4 and the grounded housing 2. Plasma discharge can be caused between the electrodes by applying RF power thereacross.

The boundary clearances 35 and 36 are formed between the susceptor 4a and the fixing frame 4b having the heater 19 and between the fixing frame 4b and the cooling block 4c, respectively. The clearances 35 and 36 are air-tightly formed by sealing members 37 and 38 such as O-rings.

The clearance 35 formed between the susceptor 4a and the heater fixing frame 4b is connected to a heat transfer gas source 52 by a pipe 49 through a valve 50 and a mass-flow controller (MFC) 51. The valve 50 is opened in response to a command from the CPU 40 to supply an inert gas such as helium from the source 52 into the clearance 35. The clearance 35 is also connected to an exhausting means 54 such as a vacuum pump by the pipe 49 through a valve 53. The valve 53 is opened in response to a command from the CPU 40, thereby exhausting the heat transfer gas contained in the boundary clearance 35.

The clearance 36 formed between the fixing frame 4b and the cooling block 4c is connected to a heat transfer gas source 58 by a pipe 55 through a valve 56 and an MFC 57. The valve 56 is opened in response to a command from the CPU 40 to supply an inert gas such as helium from the source 58 into the clearance 36. The clearance 36 is also connected to an exhausting means 60 such as a vacuum pump by the pipe 55 through a valve 59. The valve 59 is opened in response to a command from the CPU 40, thereby exhausting the heat transfer gas contained in the boundary clearance 36.

Each of the clearances 35 and 36 is formed to have a thickness of 1 to 100 μm, preferably, about 50 μm. In this embodiment, although an inert gas such as helium or argon is used as a heat transfer gas, these gases are just examples. Any heat transfer gas which has high heat conductivity and hardly reacts with the process gas in the process chamber 3 even when leakage of the heat transfer gas occurs can be used.

The heat transfer gas, i.e., an inert gas, sealed in each of the clearances 35 and 36 is compressed at a pressure of 300 Torr or less, preferably, about 70 Torr. As shown in FIG. 6, the thermal resistance (reciprocal of heat conductivity) of each of the clearances is decreased when the pressure of the heat transfer gas is increased, but the thermal resistance becomes almost constant when the pressure exceeds 300 Torr. Therefore, when the pressure of the sealed heat transfer gas is appropriately selected in a range of less than 300 Torr, an effective, excellent heat transfer path can be formed in the mount 4.

As has been described above, in the plasma etching apparatus 1 to which temperature control of the susceptor 4a based on the present invention can be applied, a heat transfer gas can be sealed or exhausted in/from the clearances 35 and 36 formed between the members under the control of the CPU 40 in accordance with operation modes (to be described later). At the same time, supply of a cold amount from the refrigerant reservoir 27 serving as a cold source to the susceptor 4a can be adjusted. As a result, a heat transfer path suitable for each mode can be formed in the mount 4. For this reason, consumption of a cold source such as liquid nitrogen can be minimized, and controllability of the mount temperature can be improved.

The arrangement of an etching system including the plasma etching apparatus will be described below with reference to FIG. 2. The same reference numerals as in the above-described plasma etching apparatus denote the same parts in the etching system, and a description thereof will be omitted.

As shown in FIG. 2, a load lock chamber 151 is connected to the housing 2 of the process chamber 3 of the plasma etching apparatus 1 according to the present invention through a gate 150 which can be opened/closed. A transfer member, e.g., a transfer arm 152 formed by coating an arm consisting of aluminum with conductive Teflon to obtain a countermeasure against static electricity is arranged in the load lock chamber 151. An exhaust pipe 153 is connected to the load lock chamber 151 through an exhaust opening formed in the bottom surface of the load lock chamber 151. A vacuum pump 155 is connected to the exhaust pipe 153 through a vacuum exhaust valve 154, and the load lock chamber 151 can be evacuated.

A cassette chamber 157 is connected to the side wall of the load lock chamber 151 through a gate 156 which can be opened/closed. A table 159 for placing a cassette 158 thereon is arranged in the cassette chamber 157. The cassette 158 can store, as one lot, 25 semiconductor wafers W serving as substrates to be processed. In addition, an exhaust pipe 160 is connected to the cassette chamber 157 through an exhaust opening formed in the bottom surface of the cassette chamber 157. The vacuum pump 155 is connected to the exhaust pipe 160 through a vacuum exhaust valve 161, and the cassette chamber 157 can be evacuated. The other side wall of the cassette chamber 157 communicates with the atmospheric air through a gate 162 which can be opened/closed.

Figure 3:
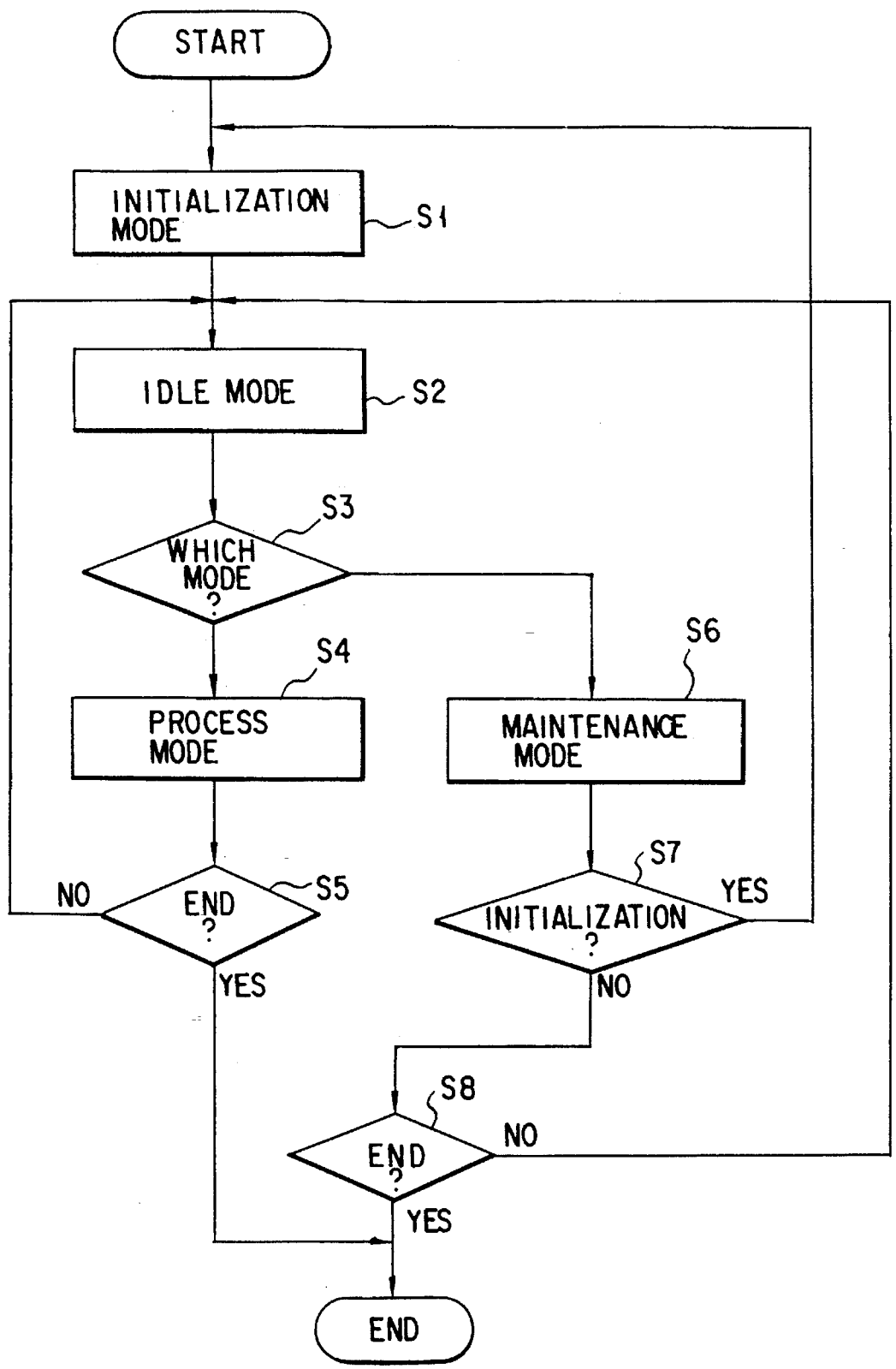
FIG. 3 is a flow chart showing an operation of the apparatus shown in FIG. 1.
Figure 5:
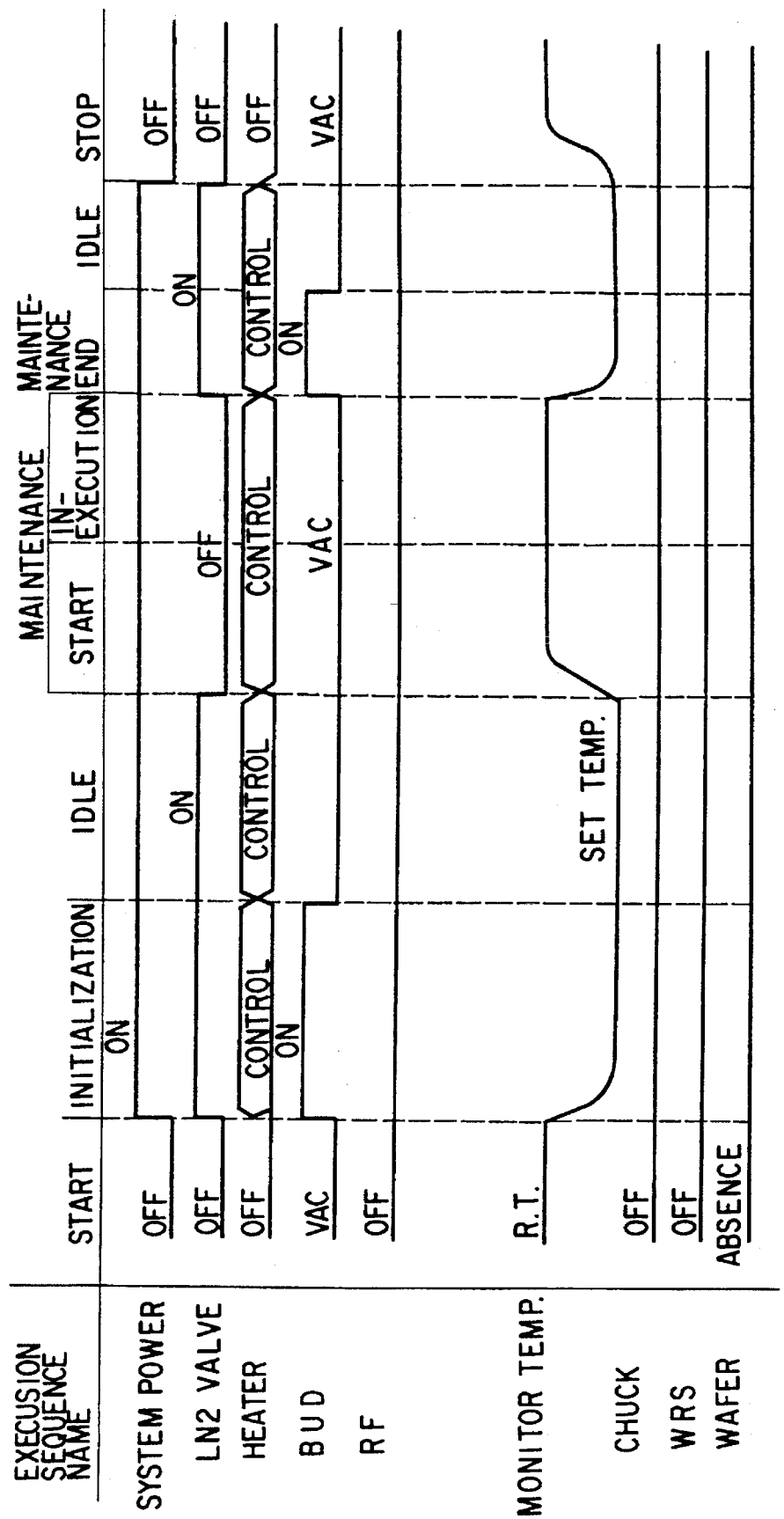
FIG. 5 is a timing chart of an operation including a maintenance mode of the apparatus shown in FIG. 1.

An operation of the plasma etching apparatus 1 will be described below with reference to the flow chart shown in FIG. 3 and the timing charts of cooling sequences shown in FIGS. 4 and 5. The operation of the plasma etching apparatus 1 is executed on the basis of a program stored in the CPU 40. In FIGS. 4 and 5, "BUD" represents the pressure (supply and exhaust of heat transfer gas) of the clearance 36 between the heater fixing frame 4b and cooling block 4c; and "WRS", the presence/absence of supply of a heat transfer gas to the gap 15 between a semiconductor wafer W and the electrostatic chuck 11.

When the plasma etching apparatus 1 is started, an initialization mode (step S1) is set.

Initialization Mode (Step S1)

In an initialization mode, the plasma etching apparatus 1 is entirely initialized. That is, when system power is turned on, the valves 50 and 56 are opened, inert gases such as helium from the heat transfer gas sources 52 and 58 set at a predetermined pressure are supplied to the clearance 35 between the susceptor 4a and the fixing frame 4b and the clearance 36 between the fixing frame 4b and the cooling block 4c through the MFCs 51 and 57, respectively, thereby setting the clearances 35 and 36 in heat transfer gas sealing states. As a result, a heat transfer path extending from the refrigerant reservoir 27 to the upper surface of the electrostatic chuck 11 is formed or completed. At the same time, the valve 29 is opened, and liquid nitrogen is supplied from the liquid nitrogen source 30 into the refrigerant reservoir 27. The liquid nitrogen in the refrigerant reservoir 27 functions as a cold source, and cools down the mount 4 through the heat transfer path formed in the mount 4. The degree of this cooling is monitored by the temperature sensor 22 arranged in the fixing frame 4b. when the temperature of the mount 4 reaches a predetermined temperature, an idle mode (step S2) is set.

Idle Mode (Step S2)

When the idle mode is set, the valves 53 and 59 are opened, and the vacuum pumps 54 and 60 are driven. The heat transfer gases sealed in the clearances 35 and 36 formed between the members of the mount 4 are exhausted to set the clearances 35 and 36 in almost vacuum states. As a result, the heat transfer path formed in the mount 4 is cut or severed by two vacuum heat insulating layers, and heat hardly escapes through the heat transfer path. Therefore, the mount 4 cooled to the predetermined temperature in the initialization mode can be kept at this temperature.

While this state is kept, in step S3, the CPU 40 inquires of an operator whether processing of the semiconductor wafer W in the process chamber 3 or maintenance of the process chamber 3 is to be performed next. When the operator selects processing of the wafer W, a process mode (step S4) is executed.

Process Mode (Step S4)

When the process mode is selected, wafers W are loaded while the idle state is kept. That is, as shown in FIG. 2, the gate 162 arranged between the cassette chamber 157 and the atmospheric air is opened. The cassette 158 storing one lot of wafers W, i.e., 25 wafers, is placed on the table 159 in the cassette chamber 157 by a convey robot (not shown), and the gate 162 is closed. Subsequently, the valve 161 connected to the cassette chamber 157 is opened, and the cassette chamber 157 is exhausted to have a vacuum atmosphere, e.g., a pressure of $10^{-1}$ Torr.

The gate 156 between the load lock chamber 151 and the cassette chamber 157 is opened, and one of the wafers W is extracted from the cassette 158 by the transfer arm 152. The wafer W is transferred into the load lock chamber 151 by the arm 152, and the gate 156 is closed. Subsequently, the valve 154 connected to the load lock chamber 151 is opened, and the load lock chamber 151 is exhausted by the vacuum pump 155 to have a vacuum atmosphere, e.g., a pressure of $10^{-3}$ Torr.

The gate 150 between the load lock chamber 151 and the process chamber 3 is opened, the wafer W is transferred into the process chamber 3 by the arm 152 and placed on the susceptor 4a, and the gate 150 is closed. In the meantime, the valve 163 is opened, and the process chamber 3 is exhausted by the vacuum pump 155 to have a vacuum atmosphere, e.g., a pressure of $10^{-5}$ Torr.

Thereafter, the switch of the DC power supply 14 is turned on to apply a high DC voltage of, e.g., 2.0 kV, to the conductive film 12 of the electrostatic chuck 11. In this manner, static electricity is generated by polarization on the surface of the electrostatic chuck 11, and the wafer W is chucked by the Coulomb's force onto the upper surface of the electrostatic chuck 11.

After the wafer W is chucked, the valve 17 is opened, and a heat transfer gas such as helium from the heat transfer gas source 16 is supplied into the gap 15 between the electrostatic chuck 11 and the wafer W. In this manner, a heat transfer path extending from the refrigerant reservoir 27 to the wafer W is completed. As a result, the target surface of the wafer W can be cooled to a desired temperature.

A process gas is supplied from the pipe 5a into the process chamber 3 through the MFC 5c. RF power is supplied from the RF power supply 25 to the fixing frame 4b through the matching circuit 32, and plasma etching for the wafer W is started. In the plasma etching apparatus 1, the permanent magnet 7 arranged above the housing 2 is rotated to form a magnetic field parallel to the target surface of the wafer W. In this manner, ions can be directed in the direction perpendicular to the wafer W, and etching having high anisotropy can be achieved.

During the plasma etching, the temperature of the susceptor 4a may vary due to the generated plasma. However, in the plasma etching apparatus 1, the temperature of the susceptor 4a is monitored by the sensor 21. The temperature of the susceptor 4a can be set within an allowable variation range by selectively driving the heater 19 through the heater driver 20 in response to a signal from the sensor 21.

Upon completion of the desired etching, the RF power supply 25 is stopped, the generation of the plasma is stopped, and the supply of the process gas is stopped. In addition, in order to displace the process gas or reaction products in the process chamber 3, an inert gas such as nitrogen is supplied into the process chamber 3, and the process chamber 3 is exhausted by the vacuum pump 155.

After the residual process gas and reaction products in the process chamber 3 are sufficiently exhausted, the gate 150 arranged on a side surface of the process chamber 3 is opened. The transfer arm 152 extends from the load lock chamber 151 to the position of the wafer W in the process chamber 3, and holds the wafer W to transfer it to the load lock chamber 151. Then, the gate 150 is closed. In the load lock chamber 151, the temperature of the wafer W is increased to room temperature, e.g., 18° C. Thereafter, the wafer W is unloaded from the load lock chamber 151 into the cassette chamber 157 and then into the atmospheric air along with the other wafers as one lot.

In addition, when the process is to be performed, it is often desirable to quickly increase the temperature of the susceptor 4a from, e.g., $-150°$ C. to $-100°$ C. In this case, the valve 50 is opened to set the clearance 35 in a heat transfer gas sealing state, and the clearance 36 is kept in an almost vacuum state. In this manner, the heat transfer path is severed into two parts formed between the refrigerant reservoir 27 and the susceptor 4a and between the refrigerant reservoir 27 and the heater fixing frame 4b, thereby preventing unnecessary consumption of the refrigerant. In addition, when power supplied to the heater 19 is effectively used, the temperature of the mount 4 can be rapidly increased to a desired temperature.

Upon completion of the process mode, in step S5, the CPU 40 inquires of the operator whether to end the process, or to continue processing of wafers of another lot stored in another cassette or to perform maintenance of the apparatus 1. When the operator selects the continuous processing or maintenance, e.g., when the operator selects NO, the flow returns to the idle mode (step S2). During exchange between lots for the continuous processing, the heat transfer path formed in the mount 4 is severed to minimize a heat loss. If the operator selects YES in step S5, the flow ends.

When the operator selects the maintenance of the process chamber 3 in step S3, the CPU 40 executes a maintenance mode (step S6).

Maintenance Mode (Step S6)

When the maintenance mode is set, the valve 50 is opened, the clearance 35 is set in a heat transfer gas sealing state, and the clearance 36 is kept in an almost vacuum state. In this manner, the heat transfer path is cut or severed between the cooling block 4c and the fixing frame 4b to prevent unnecessary consumption of the refrigerant. The temperature of the susceptor 4a and the fixing frame 4b can be quickly increased to room temperature by effectively using the power supplied to the heater 19.

After the temperature of the susceptor is sufficiently increased, the process chamber 3 is opened to the ambient atmosphere, maintenance such as cleaning of the interior of the process chamber 3 or replacement of the contaminated upper susceptor 4a with a new one is performed. Upon completion of the maintenance, in step S7, the CPU 40 inquires of the operator whether the apparatus 1 must be initialized. When the operator selects YES, the flow returns to the initialization mode (step S1).

When the operator selects NO in step 7, the CPU 40 inquires of the operator, in step 8, whether the process is to be ended or processing of the wafers is to be performed. When the operator selects the processing, e.g., NO, the flow returns to the idle mode (step S2). When the operator selects YES in step S8, the flow ends.

Table 1 shows relationships between temperature control (TC) of the susceptor 4a, supply (LN2) of liquid nitrogen to the cooling block 4c, the pressure (BUD) of the clearance 36 between the fixing frame 4b and the cooling block 4c, and setting of functions (PID) used in proportional-plus-integral-plus-derivative control of a control program stored in the CPU 40. In this case, functions PID#1 and PID#3 indicate that these functions are substantially set in accordance with the heat response of the mount 4 itself, and a function PID#2 indicates that this function is set in accordance of the heat response of the mount 4 in consideration of heat entrance caused by a plasma.

TABLE 1

| TC | LN2 | BUD | PID | Mode |
|---|---|---|---|---|
| Quick Cooling | on | on | #1 | Initialization |
| Saving Energy | on | VAC | #3 | Idle |
| High-speed Response | on | on | #2 | Process |
| Return to Room Temperature | on | VAC | #3 | Maintenance |

Another characteristic feature of the present invention in the process mode will be described below with reference to FIGS. 7 to 10.

As described above, in low-temperature etching, in order to increase the production yield and perform microprocessing on a surface, it is important to keep the wafer temperature within an allowable temperature difference range, e.g., $-100° ±5°$ C. In order to control the wafer temperature to fall within the temperature range, according to the etching method of the present invention, without changing etching conditions of the wafer, e.g., the RF power supply 25, the temperature adjustment can be performed by only the heater 19 arranged in the fixing frame 4b while the etching process is continued.

FIGS. 7 to 9 show timing charts when a plurality of wafers are continuously processed. In each of the charts, $[t_2$ to $t_3]$ is a time period corresponding to one cycle required for etching one wafer, and similarly, $[t_4$ to $t_5]$ is a time period corresponding to one cycle required for etching another wafer. As shown in FIGS. 7 to 9, the RF power supply is kept in an ON state during etching, and RF discharge is continued without any interruption.

However, heat energy generated by a plasma varies by variations in RF power, pressure in the process chamber, and flow rate of the process gas, or by-products produced by etching, and the wafer temperature varies accordingly. In order to control the varying wafer temperature to fall within a desired range, while the RF power is kept in an ON state, only an output from the heater 19 is adjusted by the controller 40 according to a signal transmitted from the temperature sensor 21 of the susceptor 4a to the controller 40 through the temperature monitor 24.

As described above, when only the output from the heater 19 is feedback-controlled according to the signal transmitted through the temperature monitor 24, the wafer temperature can be kept within the desired range. However, a certain regularity may be empirically found between adjustment of the input power to the heater 19, i.e., the heat amount required for the heater 19 and processing conditions such as a wafer to be processed and a process gas. In this case, a plurality of wafers can be continuously, periodically processed without being feedback-controlled. That is, when the input power to the heater 19 is continuously controlled on the basis of a predetermined periodic function approximating the regularity of the input power, effective processing can be easily performed.

For example, in the example shown in FIG. 7, when the input power to the heater 19, i.e., the heat amount of the heater 19 is adjusted on the basis of a triangular wave periodic function having a peak at time $t_2$, the wafer temperature can be controlled to fall within a desired etching temperature control range. In the example shown in FIG. 8, the input power to the heater 19 is adjusted on the basis of a quadratic periodic function having a peak at time $t_2$. Furthermore, in the example shown in FIG. 9, the input power to the heater 19 is adjusted on the basis of a saw-tooth wave periodic function triggered at times $t_1$, $t_3$, and $t_5$. When the input power of the heater 19 is adjusted as described above, the wafer temperature can be controlled to fall within a desired etching temperature range.

The peak timing of the input power to the heater 19, i.e., the timing of maximum heating, need not coincide with the ON timing of the RF power supply. As shown in FIG. 10, the ON timing of the RF power supply, i.e., the start timings ($t_2$, $t_4$) of the processing time period of each wafer, can be set to be shifted from the peak timings ($t_2'$, $t_4'$) of the input power to the heater 19. However, when the present invention is applied to continuous processing of a plurality of wafers, it is important that the period of the input power to the heater 19 coincides with the processing time period of each wafer.

A modification wherein a plasma emission detection unit 70 is arranged in the plasma etching apparatus 1 will be described below with reference to FIG. 11. FIG. 11 shows only a part of the apparatus 1 directly associated with the plasma emission detection unit 70. Parts of the apparatus 1 except for the part shown in FIG. 11 are the same as those shown in FIG. 1.

In the modification shown in FIG. 11, the plasma emission detection unit 70 is used for measuring the emission strength of a plasma PL generated by the RF power supply 25 in the process chamber 3. The variation period of an observation signal of a plasma emission intensity obtained through the detection unit 70 is calculated by a frequency calculation unit 76. The calculation unit 76 sends the calculation result to the CPU 40 through a proper bus. The CPU 40 performs various control processes of the overall apparatus on the basis of the signal.

The plasma emission detection unit 70 comprises an opening 71 formed at a position where the opening 71 does not interfere with the wafer load/unload gate 150 (FIG. 2) on the side wall of the process chamber casing 2. A transparent member 72 consisting of quartz glass or the like is fitted in the opening 71. An optical fiber 74 is arranged outside the transparent member 72 with a condenser lens 73 interposed therebetween.

The focal point of the condenser lens 73 is set at a predetermined position in the plasma PL. A photosensor 75 for receiving a principal ray guided by the optical fiber 74 is arranged optically behind the optical fiber 74. The photosensor 75 confirms generation of a plasma PL and measures the amount of light received from the plasma PL. The photosensor 75 sends an observation signal corresponding to the measured amount to the calculation unit 76 and the CPU 40 as an electric signal obtained by photoelectric conversion.

The calculation unit 76 calculates a plasma emission intensity observation signal input from the photosensor 75 of the detection unit 70 in accordance with a predetermined sequence to obtain its variation period. Various data signals concerning the plasma emission intensity calculated by the calculation unit 76 are sent to the CPU 40. The CPU 40 controls the overall apparatus on the basis of the received signals.

A control method according to the modification shown in FIG. 11 will be described below.

As has been described above, wafer temperature control in the process mode according to the present invention can be performed by adjusting the heater 19 arranged on a cold transfer path regardless of the ON/OFF states of the RF power supply 25. However, depending on conditions, a plasma PL may not be generated in the process chamber 3 even when the RF power supply 25 is turned on. When no plasma is generated, the wafer temperature control is meaningless, and the temperature control may conversely cause the wafer temperature to deviate from a predetermined temperature range. Especially, when a plurality of wafers are continuously processed, the period of etching process may be shifted from the period of adjustment of the heater output.

In order to avoid the above situation, after generation of a plasma is confirmed by the detection unit 70, temperature adjustment of the wafer W is performed. This control avoids an unexpected situation occurring when temperature control is performed by the heater 19 without generation of a plasma.

In the plasma etching apparatus 1, the density of the plasma PL can be partially increased by a magnetic field generated by the magnetic field generating means 7 such as a permanent magnet. The plasma whose density is partially increased is eccentrically rotated on the wafer W by the eccentric rotation of the permanent magnet 7. When the density of the plasma is locally concentrated by the magnetic field as described above, etching processing can be highly effectively performed. In addition, when a portion where the plasma is concentrated is eccentrically rotated, the etching processing can be uniformly performed over the entire surface of the wafer W.

In this case, the plasma PL generated in the process chamber 3 varies almost periodically in accordance with the eccentric rotation of the permanent magnet 7. The almost periodic change of the plasma PL can be confirmed by constantly monitoring the spectral light of reaction species or reaction products produced in the process chamber 3. According to the present invention, the variation period of a plasma emission intensity which periodically varies is calculated by the calculation unit 76, and this variation period can be used as a parameter for adjusting the heater output.

Especially, when a plurality of wafers are periodically, continuously processed, the input power to the heater 19 is adjusted in synchronism with the variation period of the plasma emission intensity. When the wafer temperature is controlled as described above, etching process having high precision can be rapidly, effectively performed.

A mechanism for controlling the pressure of the clearance 35 between the susceptor 4a and the heater fixing frame 4b and the pressure of the clearance 36 between the fixing frame 4b and the cooling block 4c will be described below with reference to FIGS. 13 to 15. FIG. 13 shows the outline of the pressure adjustment mechanism. This mechanism comprises a vacuum exhaust system 81 for evacuating the clearance 35 or 36 and a gas supply system 82 for supplying a gas having a predetermined pressure into the clearance 35 or 36.

Reference numerals different form those in FIG. 1 denote parts in FIG. 13. However, it should be understood that FIG. 13 shows the outline of each of the pressure adjustment mechanism for the clearance 35 including the members represented by reference numerals 50 to 54 in FIG. 1 and the pressure adjustment mechanism for the clearance 36 including the members represented by reference numerals 56 to 60 in FIG. 1.

A gas source 88 (corresponding to reference numerals 52 and 58 in FIG. 1) storing a heat transfer gas such as helium (He) having a predetermined pressure is connected to an end portion of the gas supply system 82. The gas source 88 is connected to an MFC 84 (corresponding to reference numerals 51 and 57 in FIG. 1) through a valve (not shown in FIG. 1) 90. The MFC 84 is connected to the clearance 35 or 36 through a valve 92 (corresponding to reference numerals 50 and 56 in FIG. 1). A pressure gauge 94 (not shown in FIG. 1) is connected between the MFC 84 and the valve 92.

The vacuum exhaust system 81 is connected on the downstream side of the valve 92. A vacuum pump 96 (corresponding to reference numerals 54 and 60 in FIG. 1) is connected to an end portion of the vacuum exhaust system 81, and a valve 98 (corresponding to reference numerals 53 and 59 in FIG. 1) is interposed between the valve 92 and the vacuum pump 96.

The CPU 40 for controlling the pressure adjustment mechanism has a timer 100 for measuring the operation time of each valve and a storage unit 102 such as a ROM for storing desired information or data in advance. The relationship, shown in FIG. 14, between the final pressure of the clearance 35 or 36 and the flow rate of the heat transfer gas is formed into a table which is stored in the storage unit 102 in advance. The graph in FIG. 14 shows the relationship between the final pressure of the clearance 35 or 36 and the flow rate of the MFC when a gas having a predetermined pressure of, e.g., 2 kg/cm$^2$, is supplied from the gas source 88 into a corresponding one of the clearances 35 and 36 having a reference pressure, e.g., 1 Torr, in a predetermined low-pressure state for a predetermined period of time (when time is fixed), e.g., 5 seconds. The CPU 40 controls the degree of opening of the MFC such that the pressure of each of the clearances 35 and 36 is set at a desired clearance pressure for obtaining a predetermined heat conductivity.

An operation of the pressure adjustment mechanism shown in FIG. 13 will be described below.

In order to keep the wafer temperature at an appropriate value by controlling the heat amount of the heater 19, the thermal resistance of a heat transfer path extending from the cooling block 4c to a wafer W, especially, the heat conductivity (corresponding to the pressure of the gas) in the boundary clearance 35 or 36, must be adjusted to an appropriate value. This adjustment operation is performed before processing of wafers is performed, or when wafer processing of a predetermined number of lots is finished, and then another lot of wafers are processed at a temperature different from that of the previous process.

The heat conductivity of each of the clearances 35 and 36 is uniquely determined by the type and pressure of a gas in this space. The pressure of the clearance, as shown in FIG. 14, depends on the flow rate varying in accordance with, e.g., the degree of opening of the MFC 84. In order to set each of the clearances 35 and 36 at a desired pressure, the valve 90 of the gas supply system 82 is set in a closed state first, the MFC 84, the valve 92, and the valve 98 of the vacuum exhaust system 81 are set in open states, and the vacuum pump 96 is driven. Therefore, the overall exhaust system including the clearances 35 and 36 is evacuated, and is kept at a reference pressure, e.g., about 10$^{-2}$ Torr. The evacuation at this time is performed while the value of the pressure gauge 94 is monitored. This reference pressure is set at a value lower than a minimum pressure value which must be set as a clearance pressure.

When the overall system is set at the reference pressure of a low pressure value, the valve 98 is closed to stop evacuation and the MFC 84 is also closed. The valve 90 is opened (the valve 92 is set in an open state), and at the same time, the MFC 84 is properly opened to cause the gas to flow at a predetermined flow rate, i.e., a flow rate corresponding to a desired predetermined pressure in FIG. 14 for a predetermined period of time (e.g., 5 seconds). Then, the MFC 84 and the valves 92 and 90 are closed. In this manner, the gas having the flow rate determined on the basis of the pressure-flow rate relationship which is formatted into a table in advance flows into the clearances 35 and 36 for the predetermined period of time (5 seconds), thereby rapidly setting each of the clearances 35 and 36 at a desired pressure.

At this time, the degree of opening of the MFC is set on the basis of the graph prestored in the storage unit 102 and shown in FIG. 14, and the open time of the MFC is measured with reference to the timer 100. FIG. 15 shows changes in pressure at this time. In FIG. 15, a line A represents a change in pressure when the desired pressure is 10 Torr, and a line B represents a change in pressure when the desired pressure is 5 Torr. As indicated by both the lines, according to the control method of the present invention, the pressure of each of the clearances rapidly, linearly increases to a predetermined pressure without overshooting or undershooting. As a result, a desired heat conductivity can be obtained quickly. A line C represents a change in pressure obtained by a conventional control method. In this case, it is found that a considerably long period of time is required for stabilizing the pressure at a desired set pressure due to overshooting or undershooting.

In the above description, although the gas supply or flow time is set to be 5 seconds, the supply time can be arbitrarily set. However, when the supply time is set to be excessively short, a required pressure precision may not be obtained. In addition, in the above description, although the gas supply time is fixed, for example, a desired pressure may be finally obtained by fixing the flow rate of the MFC and changing the supply time. The above pressure adjustment mechanism can be applied to not only the clearances 35 and 36 but also all clearances whose heat conductivities must be controlled.

Although a case wherein the present invention is applied to a plasma etching apparatus is described in above embodiment, the present invention is not limited to the embodiment, and can be applied to a CVD apparatus, an ashing apparatus, a sputtering apparatus, and a probe apparatus. In addition, the present invention can be applied to not only an apparatus using semiconductor wafers as substrates to be processed but also an apparatus for processing other substrates to be processed, such as LCD substrates.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas into said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path;

shifting a state in which the heat transfer path is severed in the idle mode to a process mode, the process mode including the steps of filling said boundary clearance with the heat transfer gas to complete the heat transfer path and the step of processing the substrate on said susceptor while cooling the substrate by cold from said second block, and observing a change in temperature of said first block; and executing an initialization mode before the idle mode is executed, the initialization mode including the step of filling said boundary clearance with the heat transfer gas to complete the heat transfer path, and wherein, after a temperature of said first block reaches a set value by cold transferred from said second block through the heat transfer path, the initialization mode is directly shifted to the idle mode.

2. A method according to claim 1, wherein the initialization mode further includes the step of observing a change in temperature of said first block.

3. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas into said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path; and shifting a state in which the heat transfer path is severed in the idle mode to a process mode, the process mode including the steps of filling said boundary clearance with the heat transfer gas to complete the heat transfer path and the step of processing the substrate on said susceptor while cooling the substrate by cold from said second block, and observing a change in temperature of said first block, wherein said first block incorporates a heater, and the process mode further includes the step of adjusting the temperature of said susceptor by selectively operating said heater and the step of exhausting said boundary clearance to set said boundary clearance in a vacuum state and to sever the heat transfer path, and operating said heater, so as to rapidly increase the temperature of said susceptor.

4. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas into said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path;

shifting a state in which the heat transfer path is severed in the idle mode to a process mode, the process mode including the steps of filling said boundary clearance with the heat transfer gas to complete the heat transfer path and the step of processing the substrate on said susceptor while cooling the substrate by cold from said second block, and observing a change in temperature of said first block; and means for generating a plasma in said process chamber, and the processing of the substrate is performed using the plasma, wherein said first block incorporates a heater, and the process mode further includes the step of adjusting a temperature of said susceptor by selectively operating said heater while the substrate to be processed on said susceptor is processed with being cooled by cold from said second block, and the step of, when a plurality of substrates to be processed are continuously processed on said susceptor, changing a heat among of said heater.

5. A method according to claim 4, wherein said apparatus further comprises plasma emission detecting means, and said heater is operated after emission from the plasma is detected by said detecting means.

6. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas into said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path;

shifting a state in which the heat transfer path is severed in the idle mode to a process mode, the process mode including the steps of filling said boundary clearance with the heat transfer gas to complete the heat transfer path and the step of processing the substrate on said susceptor while cooling the substrate by cold from said second block, and observing a change in temperature of said first block, and means for generating a plasma in said process chamber, and the processing of the substrate is performed using the plasma, wherein temperature control of said susceptor is performed substantially on the basis of heat response characteristics of said first and second blocks while the plasma is not generated, and said temperature control is performed substantially on the basis of the heat response characteristics of said first and second blocks in consideration of heat entrance caused by the plasma while the plasma is generated.

7. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas into said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path; and shifting a state in which the heat transfer path is severed in the idle mode to a process mode, the process mode including the steps of filling said boundary clearance with the heat transfer gas to complete the heat transfer part and the step of processing the substrate on said susceptor while cooling the substrate by cold from said second block, and observing a change in temperature of said first block, wherein said boundary clearance is filled with the heat transfer gas to complete the heat transfer path, said boundary clearance is set by said exhausting means at a reference pressure not more than a certain pressure, and then the heat transfer gas is supplied to said boundary clearance for a period of time at a certain flow rate determined on the basis of said pressure.

8. A method of controlling a temperature of a susceptor for supporting a substrate to be processed in a process chamber of a processing apparatus including a first block, arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas to said boundary clearance, and exhausting means for exhausting said boundary clearance, said method comprising the steps of:

executing an idle mode, the idle mode including the step of exhausting said boundary clearance to set said boundary clearance in a vacuum state so as to sever the heat transfer path; and shifting a state in which the heat transfer path is severed in the idle mode to a maintenance mode, the maintenance mode including the step of keeping the vacuum state of said boundary clearance to sever the heat transfer path and the step of opening said process chamber to an ambient atmosphere after a temperature of said first block becomes not less than a certain temperature.

9. A method according to claim 8, wherein said first block incorporates a heater, and the maintenance mode further includes the step of operating said heater to rapidly increase the temperature of said susceptor.

10. A method according to claim 9, further comprising the step of selectively, directly shifting the maintenance mode to an initialization mode after the maintenance mode is executed, the initialization mode including the step of filling said boundary clearance with the heat transfer gas to complete the heat transfer path, and wherein, after a temperature of said first block reaches a set value by cold transferred from said second block through the heat transfer path, the initialization mode is directly shifted to the idle mode.

11. A method according to claim 10, further comprising the step of selectively, directly shifting the maintenance mode to the idle mode after the maintenance mode is executed.

12. A method of controlling a temperature of a susceptor for supporting a substrate to be processed in a process chamber of a processing apparatus including a first block arranged in said process chamber and including said susceptor for supporting the substrate, a second block, arranged in said process chamber, for supplying cold to said first block, a boundary clearance being formed between said first and second blocks and on a heat transfer path, supplying means for supplying a heat transfer gas to said boundary clearance, and exhausting means for exhausting said boundary clearance, said method comprising the step of:

executing an idle mode, the idle mode including the step of exhausting said boundary clearance to set said boundary clearance in a vacuum state so as to sever the heat transfer path;

selecting one of a process mode and a maintenance mode to which the idle mode is to be shifted, in a state in which the heat transfer path is severed in the idle mode;

shifting a state in which the heat transfer path is severed in the idle mode to the process mode when the process mode is selected, the process mode including the step of filling said boundary clearance with the heat transfer gas to complete the heat transfer path and the step of processing the substrate on said susceptor while cooling the substrate by cold from said second block; and shifting a state in which the heat transfer path is severed in the idle mode to the maintenance mode when the maintenance mode is selected, the maintenance mode including the step of keeping the vacuum state of said boundary clearance to sever the heat transfer path and the step of opening said process chamber to an ambient atmosphere after a temperature of said first block becomes not less than a certain temperature.

13. A method according to claim 12, further comprising the step of executing an initialization mode before the idle mode is executed, the initialization mode including the step of filling said boundary clearance with the heat transfer gas to complete the heat transfer path, and wherein after a temperature of said first block reaches a set value by cold transferred from said second block through the heat transfer path, the initialization mode is directly shifted to the idle mode.

* * * * *